United States Patent [19]

Boyette et al.

[11] Patent Number: 5,461,324

[45] Date of Patent: Oct. 24, 1995

[54] SPLIT-FIXTURE CONFIGURATION AND METHOD FOR TESTING CIRCUIT TRACES ON A FLEXIBLE SUBSTRATE

[75] Inventors: James E. Boyette, Delray Beach; Christopher M. Fleck, Boca Raton; James C. Mahlbacher, Lake Worth; Michael Servedio, Boca Raton, all of Fla.

[73] Assignee: International Business Machines Corporation, Armonk, N.Y.

[21] Appl. No.: 287,313

[22] Filed: Aug. 8, 1994

[51] Int. Cl.⁶ .................................................. G01R 31/28
[52] U.S. Cl. ....................... 324/754; 324/73.1; 324/158.1
[58] Field of Search .................................. 324/754, 760, 324/158.1, 73.1

[56] References Cited

U.S. PATENT DOCUMENTS 5,166,607  11/1992  Long .................................... 324/760

OTHER PUBLICATIONS

IBM Technical Disclosure vol. 14 No. 12 May 1972 P. T. Flynn, "Automatic Printed Circuit and Plated Thru Hole Tester".

Primary Examiner—Kenneth A. Wieder
Assistant Examiner—Mark Wardas
Attorney, Agent, or Firm—Ronald V. Davidge; Anthony N. Magistrale

[57] ABSTRACT

A fixture is provided for locating open conditions within circuits and short conditions between adjacent circuits on a flexible substrate having circuits extending along each side, as well as individual circuits extending along both sides. In one station of the fixture, the flexible circuit extends against a conductive backing plate, and conductivity measurements, to detect open conditions, are made between two probes moving among test points on the first side of the substrate, which is opposite the backing plate, and between one of these probes and the conductive backing plate. The latter type of measurement is used particularly to detect an open condition in a via extending through the substrate. In another station of the fixture, the first side of the flexible circuit extends against a conductive backing plate having an insulating sheet adjacent to the substrate, conductivity measurements, to detect open conditions, are made between two test probes moving along a side of the substrate opposite this insulated conductive backing plate, and capacitance measurements, to detect short circuit conditions, are made between one of these probes and the insulated conductive backing plate.

20 Claims, 7 Drawing Sheets

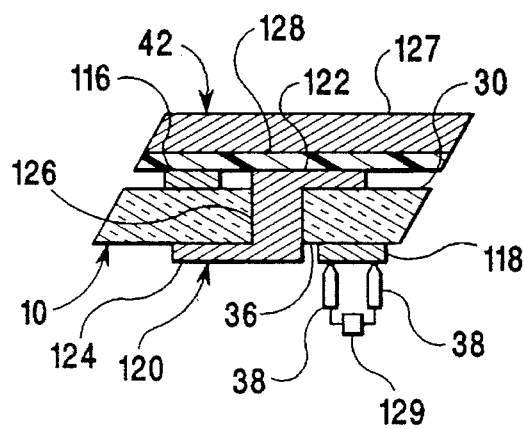
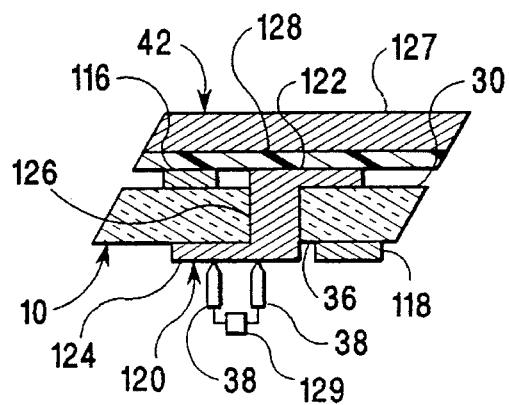
Fig. 7.                    Fig. 8.
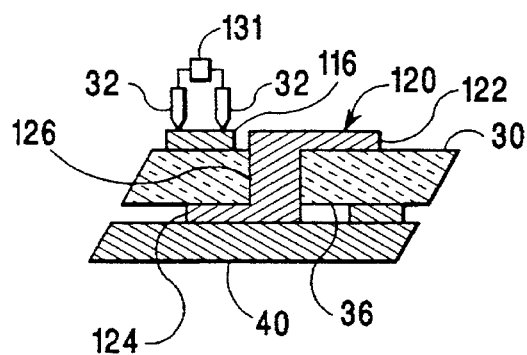
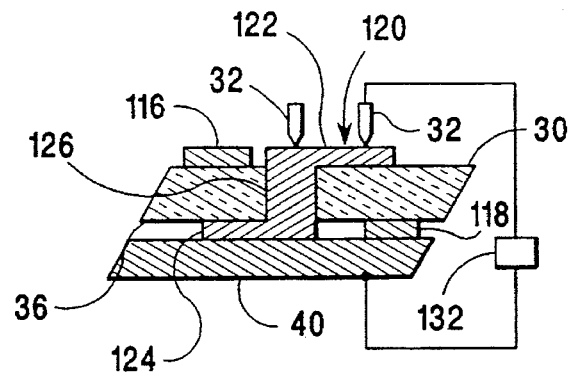
Fig. 9.                    Fig. 10.
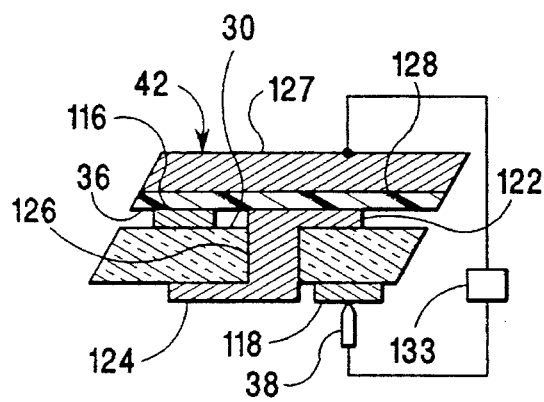
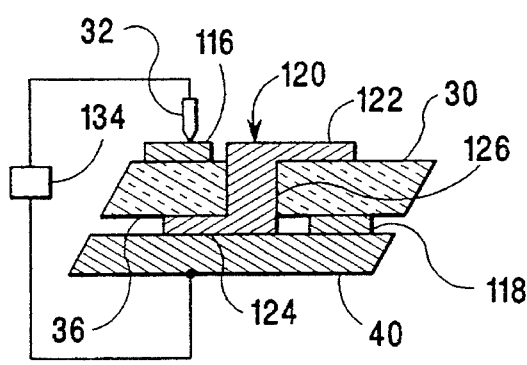
Fig. 11.                   Fig. 12.

SPLIT-FIXTURE CONFIGURATION AND METHOD FOR TESTING CIRCUIT TRACES ON A FLEXIBLE SUBSTRATE

CROSS REFERENCE TO RELATED APPLICATIONS

A co-pending U.S. application Ser. No. 176,810, filed Jan. 3, 1994, entitled "Open Frame Gantry Probing System," by James Edward Boyette, et al., having a common assignee with the present invention, the disclosure of which is hereby incorporated by reference, describes a system for moving two test probes along each side of a printed circuit being tested, and for moving the probes into engagement with the adjacent surface of the circuit when the probes are brought to the desired locations. Each of the four probes can be moved in both (X and Y) directions perpendicular to one another but parallel to the adjacent surface of the printed circuit.

A second co-pending U.S. application Ser. No. 219,610, filed Mar. 29, 1994, entitled "Testing Fixture and Method for Circuit Traces on a Flexible Substrate," by James Edward Boyette, et al., having a common assignee with the present invention, the disclosure of which is hereby incorporated by reference, describes a fixture and method for testing circuit traces extending along a flexible substrate, which is fed in a longitudinal direction between an upper plate and a lower plate, each of which includes a number of apertures extending across the flexible substrate and a number of segments extending between adjacent apertures. The apertures in the upper plate extend above the segments in the lower plate, while the apertures in the lower plate extend below the segments in the upper plate. Two test probes are moved on each side of the flexible substrate, being brought into contact with circuit traces on the substrate through the apertures. The segment on the side of the flexible substrate opposite to each aperture provides physical support for the probing process. A two-probe method may by used to determine the electrical characteristics of a circuit trace extending between test points, or a single-probe method may be used to determine the capacitance between a circuit trace and the plates. Circuit areas on the substrate are moved between the plates in a series of incremental motions to expose various points through the apertures as required to complete the testing process.

BACKGROUND OF THE INVENTION

1. Field of the Invention

This invention relates to testing printed circuits, and more particularly, to testing circuits extending along both sides of a flexible substrate for shorts and open conditions.

2. Background Information

Test processes used for printed circuit boards include a two-probe method, in which probes are simultaneously placed at two points, or nodes, on a circuit board to measure the electrical characteristics, such as resistance and continuity, of the portion of the circuit extending between these points, and a single-probe method, in which a probe is placed at a single point on the circuit board to measure the capacitance between a portion of the circuit extending from this point and a conductive surface separated from the circuit by dielectric material. This conductive surface may be a part of a circuit board being tested, such as a ground or voltage plane in a multi-layer circuit board, or it may be a conductive surface to which the circuit is held during the test process.

Circuit board testing is typically concerned with detecting the presence of electrical "shorts" or "opens." A shod occurs when two adjacent circuits, which should be separated, are inadvertently electrically connected instead. An open occurs when there is a break in a circuit line extending between two points which should be electrically connected. Both the two-probe method and the single-probe method can be used to locate both shorts and opens. However, while the two probe method is adept at finding opens by simultaneously probing the two points which should connected, the use of this method to find shorts is particularly complex and time consuming. With this method, while a first probe is held on a first point, a second probe must be moved among all of the other test points connected to circuit traces which are at some point adjacent to the circuit extending from the first point. With the single-probe method, the capacitance between each test point and the conductive plane is checked. If this capacitance is below an expected minimum, it is determined that an open has apparently occurred. If this capacitance is above an expected maximum, it is determined that a short has apparently occurred. Thus, the single-probe method greatly reduces the number of tests otherwise required to adequately check for shorts using the two-probe method.

Circuit test processes of these types may be performed on flexible substrates, as well as on rigid printed circuit boards. Flexible substrates include individual layers, which are eventually laminated together to form rigid multi-layer circuit boards, and flexible circuits of various types, which are increasingly used to provide circuits that can be formed into various shapes and to provide circuits that can be changed in shape during their operation. Many of these flexible materials are supplied and tested in a reel to reel form. In general, flexible materials must be supported through the test process. A backing support on the side of the materials opposite the side to which the probes are applied is particularly important, since the mechanical forces applied to the circuit by the probes must be resisted. Also, it is desirable to hold the flexible material flat during the test process, or to otherwise control its geometry relative to the locations of the probes. Furthermore, if the single-probe method is to be used with a flexible circuit not having a conductive plane, a backing plate must provide the conductive plane to which circuit capacitance is measured.

In a number of circuit applications, circuit traces are provided on both sides of flexible material. In such applications, it is particularly desirable to test both sides of the circuit simultaneously, to improve the throughput of a test process which would otherwise require two passes and to minimize damage to the circuits which might otherwise occur during handling through two passes. Circuits on the opposite sides of both circuit boards and flexible substrates are often connected by vias extending through the insulating substrate material, so that an individual circuit line extends partly along each side of the insulating material, What is needed is a method to provide for simultaneously testing circuits on both sides of either a rigid circuit board or a flexible substrate, using either the two-probe or single probe method. This method should provide physical support to the circuit material during the engagement of various probes, while providing a conductive backing layer as required by the single-probe method, and while providing clearance for the movement of probes to engage various circuit points.

DESCRIPTION OF THE PRIOR ART

A number of U.S. patents describe methods for supporting and testing integrated circuit chips placed individually on an elongated flexible strip fed through a test fixture. For test purposes, circuit traces on the strip are individually electrically connected to various circuit pads on each circuit chip. For example, U.S. Pat. No. 4,987,365 to Shreeve et al. describes the use of a pressure plate to hold the strip against a support plate, as a number of probes in a fixture are brought into contact with the strip through holes in the pressure plate, as the test is conducted with all probes held in contact with the strip, and as the probes are subsequently withdrawn away from the strip. U.S. Pat. No. 5,189,363 to Bregman et al. describes a testing system in which the tape is patterned with an array of cantilevered contact leads held in contact with the I/O terminals of the circuit chip during the testing process. U.S. Pat. No. 5,237,268 to Honma et al. describes the use of a film-like probe superimposed on the elongated flexible strip carrying the circuit chips, with circuit traces on the film-like probe connecting the circuits on the elongated flexible strip with external circuits.

While these devices are configured particularly for probing circuits extending along an elongated flexible strip, which may, for example, be presented to the test fixture as it is pulled from one reel to another, no provision is made for probing circuits on opposite sides of the strip. In the circuit chip testing application described by Shreeve, Bregman, and Honma, the circuit traces on the flexible strip are electrically connected to circuit pads extending generally around the circuit chip in such a way that there is no need to provide circuit traces on both sides of the flexible strip. Furthermore, the devices described these patents are configured to engage various test positions on the elongated flexible strip with a fixed array of probe points. While this approach is well suited for testing circuit chips having similar patterns of I/O contacts to connect to the circuits of the elongated strip, a more flexible approach, allowing probes to be moved rapidly to form a more flexible testing system, which can handle various applications for flexible circuits having circuit lines extending along both sides of the flexible substrate, what is still needed is a method allowing the probing of circuits at various points extending throughout the circuit area on each side of the flexible strip, while providing mechanical backing on each side of the flexible strip to support the probing process.

U.S. Pat. No. 5,138,266 to Stearns describes a test arrangement for printed wiring boards or the like, employing a probe contacting various nodes of the circuit board to charge or discharge these nodes. A reference plane of electrically conductive material is closely spaced from the board under test, and a charge-transfer detection or measurement arrangement is connected to this reference plane. The circuit board is mounted on an X-Y positioning mechanism while the test is being conducted, so the probe can be selectively applied to each of the conductive nodes of the circuit board. The charging of the nodes by capacitive coupling to the reference plane is measured and correlated with the probe position to provide an indication of circuit integrity. The measurements made on the board under test are compared with a reference data file of the X-Y coordinates of the nodes to determine whether there are discrepancies and, if so, the locations thereof.

SUMMARY OF THE INVENTION

In accordance with one aspect of the invention there is provided apparatus for measuring the electrical characteristics of circuit patterns extending along both sides of a flexible substrate. The apparatus includes a substrate feeding mechanism, first and second stations, and electronic measuring apparatus. The substrate feeding mechanism feeds the substrate through the apparatus in a longitudinal direction. Within the first station, a first probe is movable adjacent to, and into contact with, a first side of the substrate, and a first backing plate extends adjacent a second side of the substrate, opposite the first side. Within the second station a second probe is movable adjacent to, and into contact with, the second side of the substrate, and a second backing plate extends adjacent the first side of the substrate. The electronic apparatus is connected to the first and second proves to measure circuit characteristics.

BRIEF DESCRIPTION OF THE DRAWINGS

A preferred embodiment of the subject invention is hereafter described with specific reference being made to the following Figures, in which:

FIG. 7 is a fragmentary schematic vertical cross-section of the test fixture of FIG. 2, showing a two-probe test being applied to a circuit extending entirely along a lower surface of the flexible substrate;

FIG. 8 is a fragmentary schematic vertical cross-section of the test fixture of FIG. 2, showing a two-probe test being applied to a section of a circuit extending along a lower surface of the flexible substrate;

FIG. 9 is a fragmentary schematic vertical cross-section of the test fixture of FIG. 2, showing a two-probe test being applied to a circuit extending entirely along an upper surface of the flexible substrate;

FIG. 10 is a fragmentary schematic vertical cross-section of the test fixture of FIG. 2, showing a two-probe test being applied to a circuit extending along an upper surface of the flexible substrate and through a via within the flexible substrate;

FIG. 11 is a fragmentary schematic vertical cross-section of the test fixture of FIG. 2, showing a single-probe test being applied to a circuit extending along a lower surface of the flexible substrate;

FIG. 12 is a fragmentary schematic vertical cross-section of the test fixture of FIG. 2, showing a single-probe test being applied to a circuit extending along an upper surface of the flexible substrate;

DETAILED DESCRIPTION

Figure 1:
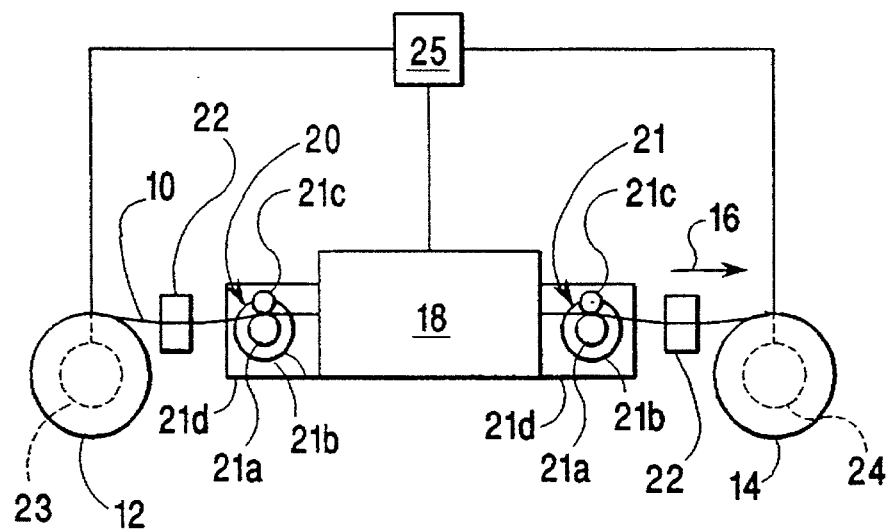
FIG. 1 is a front schematic view of a feed mechanism drawing a flexible substrate through a circuit test fixture.

FIG. 1 is a front schematic view of a feed mechanism drawing a flexible substrate through a circuit test fixture built in accordance with the present invention. The flexible substrate 10 is pulled from a supply roll 12 to a take-up roll 14, in the direction of arrow 16 through a circuit test fixture 18.

In the performance of various tests on the circuit traces extending along flexible substrate 10, the substrate must be moved and stopped a number of times, exposing various sections of the substrate within the circuit test fixture 18. To facilitate such motion, a first nip roll assembly 20 and a second nip roll assembly 21 are driven, advancing flexible substrate 10 in the direction of arrow 16 and stopping the motion of substrate 10 as required for the performance of various tests. Each nip roll assembly 20 or 21 includes a roller 21a, accurately driven by a servomotor 21b, while another roller 21c serves as an idler roller providing a clamping force on flexible substrate 10 as it passes between these rolls 21a and 21c. In this way, flexible substrate 10 is constrained to move according to the rotation provided by the servomotor 21b with minimal slippage. The two nip roll assemblies 20 and 21, which are rigidly connected to circuit test fixture 18 by means of a framework 21d, are operated to maintain tension on the flexible substrate 10 as is it moved through circuit test fixture 18.

Remaining portions of flexible substrate 10, between supply roll 12 and first nip roll assembly 20, and between second nip roll assembly 21 and take-up roll 14, are maintained in a controlled slack condition. Each of these portions is fed through a slack condition sensor 22, in which a first photodetector (not shown) provides a first indication when the substrate 10 droops too low while a second photodetector (also not shown) provides a second indication when the substrate 10 is pulled into a tight condition. This controlled slack condition is maintained through the rotation of supply roll 12 by a supply roll servomotor 23, and through the rotation of take-up roll 14 by take-up roll servomotor 24.

An electronic controller 25 provides the signals necessary to drive the servomotors 21b, 23 and 24. At least one of the nip roll drive servomotors 21b is preferably of a well-known type including an emitter producing pulses with the rotation of its output shaft, which, in this case, drives an associated roller 21a. These pulses are returned to electronic controller 25, which uses these pulses to determine the distance through which flexible substrate 10 is driven. In this way, the servomotors 21b are used to drive flexible substrate 10 in an intermittent fashion, stopping at preferred locations so that circuit tests can be performed within circuit test fixture 18. Controller 25 also provides timed signals to devices within test fixture 18.

A number of somewhat different technologies can readily be used to provide the desired results in feeding flexible substrate 10. For example, each of the servomotors 21a and 24 may be replaced by stepper motors, and servomotor 23 may be replaced by a braking device to maintain tension in the substrate. Manual or automatic adjustments of roller alignment may be applied to achieve the proper tracking of the substrate 10 through the apparatus. Various components of an automated system for feeding a flexible web, such as flexible substrate 10, may be obtained from Preco Industries, Inc. of Lanexa, Kans.

Figure 2:
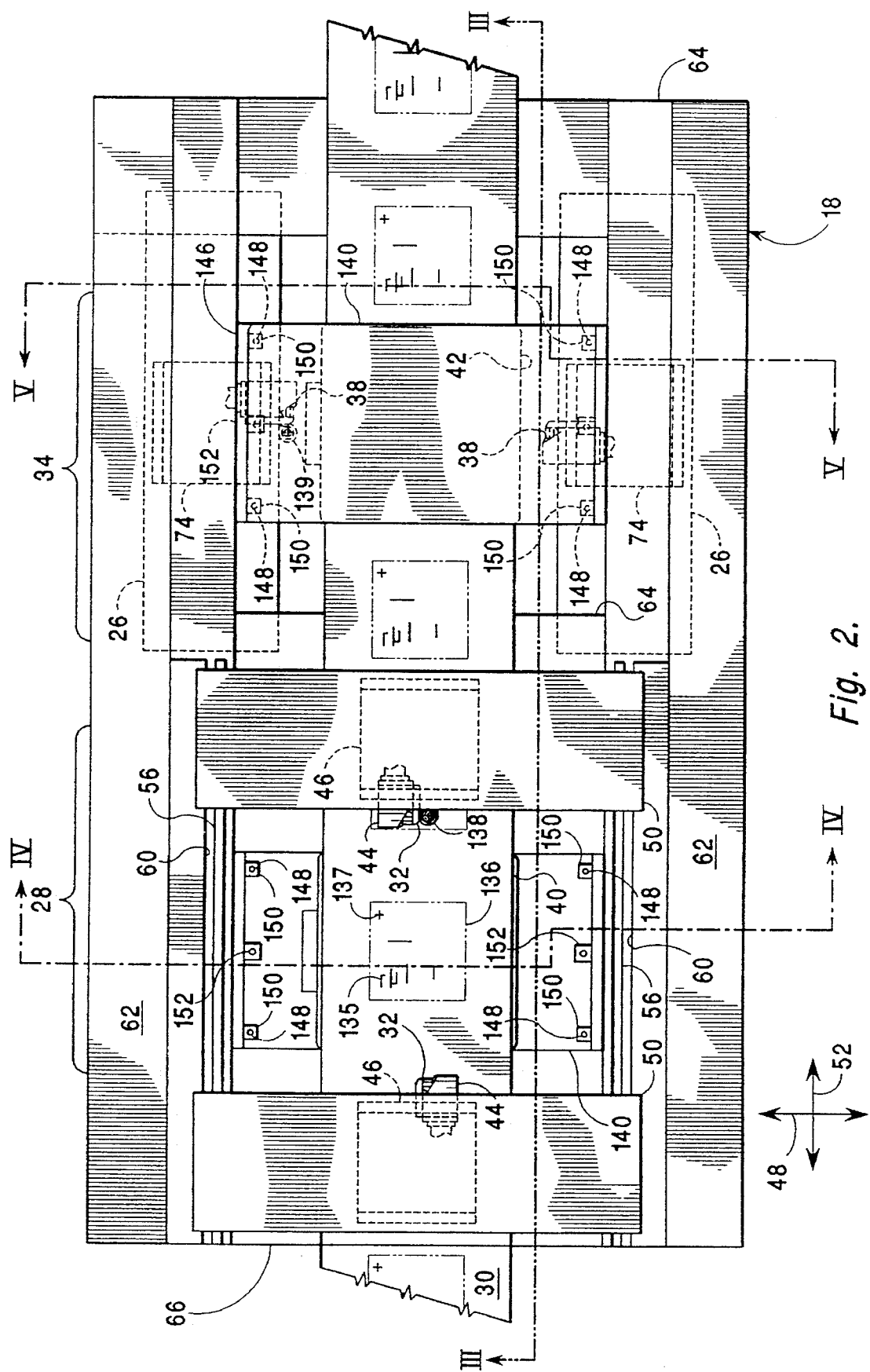
FIG. 2 is a plan view of the circuit test fixture within FIG. 1.

Within circuit test fixture 18, various electrical tests are applied to circuit traces on both sides of flexible substrate 10, as contact probes move rapidly among various test points. The general construction of devices to hold and move probe tips will first be discussed in reference to FIGS. 2–5. Then a gantry structure used to move a single probe tip will be discussed in greater detail in reference to FIG. 6. FIGS. 2–5 are views of circuit the circuit test fixture 18, with FIG. 2 being a plan view, and FIGS. 3–5 being vertical cross-sectional views taken as indicated in FIG. 2 by section lines III—III, IV—IV, and V—V, respectively. FIG. 6 is an isometric view of a lower gantry structure 26 forming a part of circuit test fixture 18.

Figure 3:
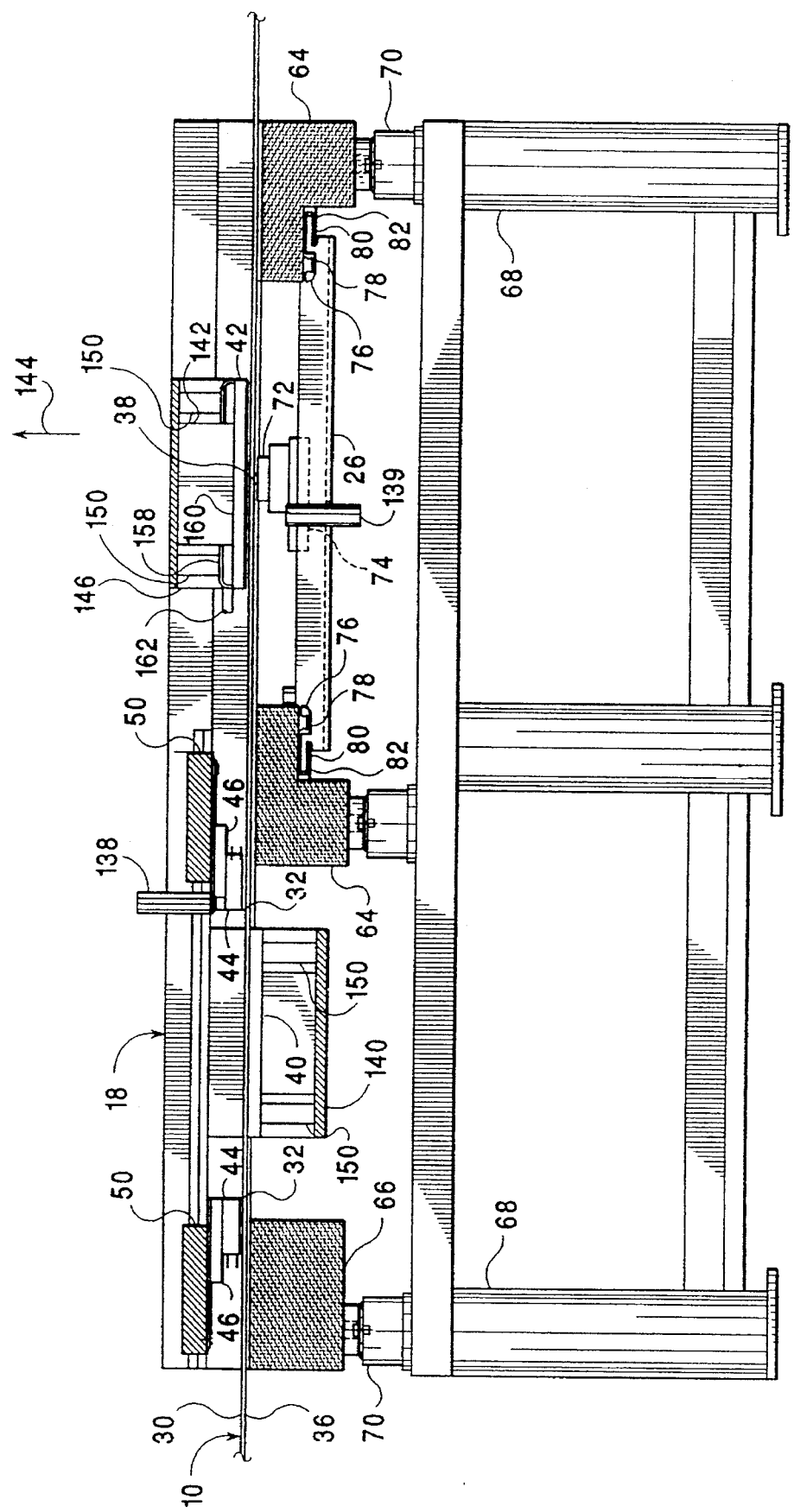
FIG. 3 is a vertical cross-section of the circuit test fixture of FIG. 2, taken as indicated by section lines III—III in FIG. 2.

Referring first to FIGS. 2 and 3, circuit test fixture 18 is divided into a left portion 28, in which circuit positions on an upper surface 30 of flexible substrate 10 are probed by means of upper probe tips 32, and a right portion 34, in which circuits on a lower surface 36 of flexible substrate 10 are probed by means of lower probe tips 38. Flexible substrate 10 extends through the test fixture 18 above a lower backing plate 40 in left portion 28 and below an upper backing plate 42 in right portion 34.

Figure 4:
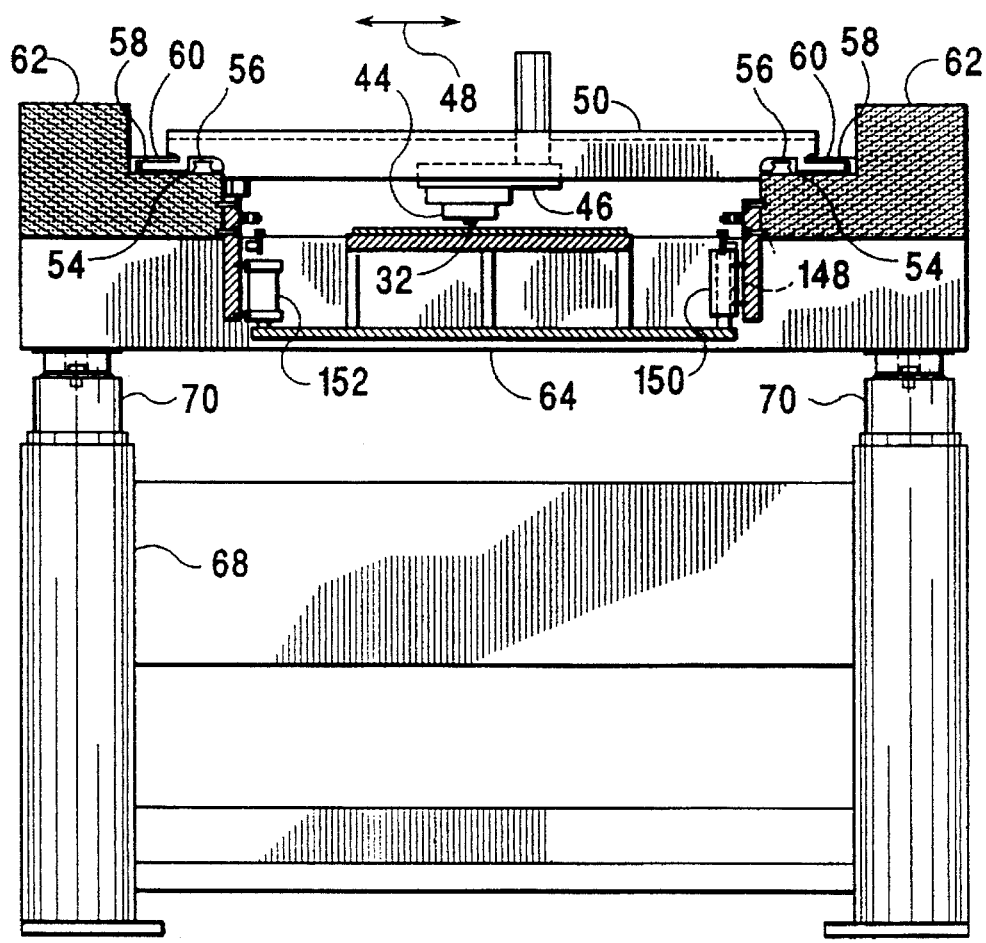
FIG. 4 is a vertical cross-section of the circuit test fixture of FIG. 2, taken as indicated by section lines IV—IV in FIG. 2.

Referring to FIGS. 2–4, each upper probe tip 32 extends downward from an upper probe carrier 44, which is mounted on an upper carriage 46. Each upper carriage 46 is driven transversely to flexible substrate 10, in the directions of arrow 48, within an upper gantry structure 50. Each upper gantry structure 50 is driven longitudinally along flexible substrate 10, in the directions of arrow 52, with upper gantry bearings 54 sliding along upper rails 56, as electrical current is applied to a linear motor 58 travelling within a magnet channel 60 at each end of the gantry structure 50. To provide the stability needed for the measurement process, upper rails 56 and the adjacent magnet channels 60 are fastened to a pair of longitudinally extending notched granite beams 62 at the front and rear of the test fixture 18. These beams 62 are fastened to a pair of transversely extending notched granite beams 64 and to a transversely extending rectangular beam 66, which are in turn fastened to a steel support structure 68 by means of shock-absorbing mounting pads 70.

Figure 5:
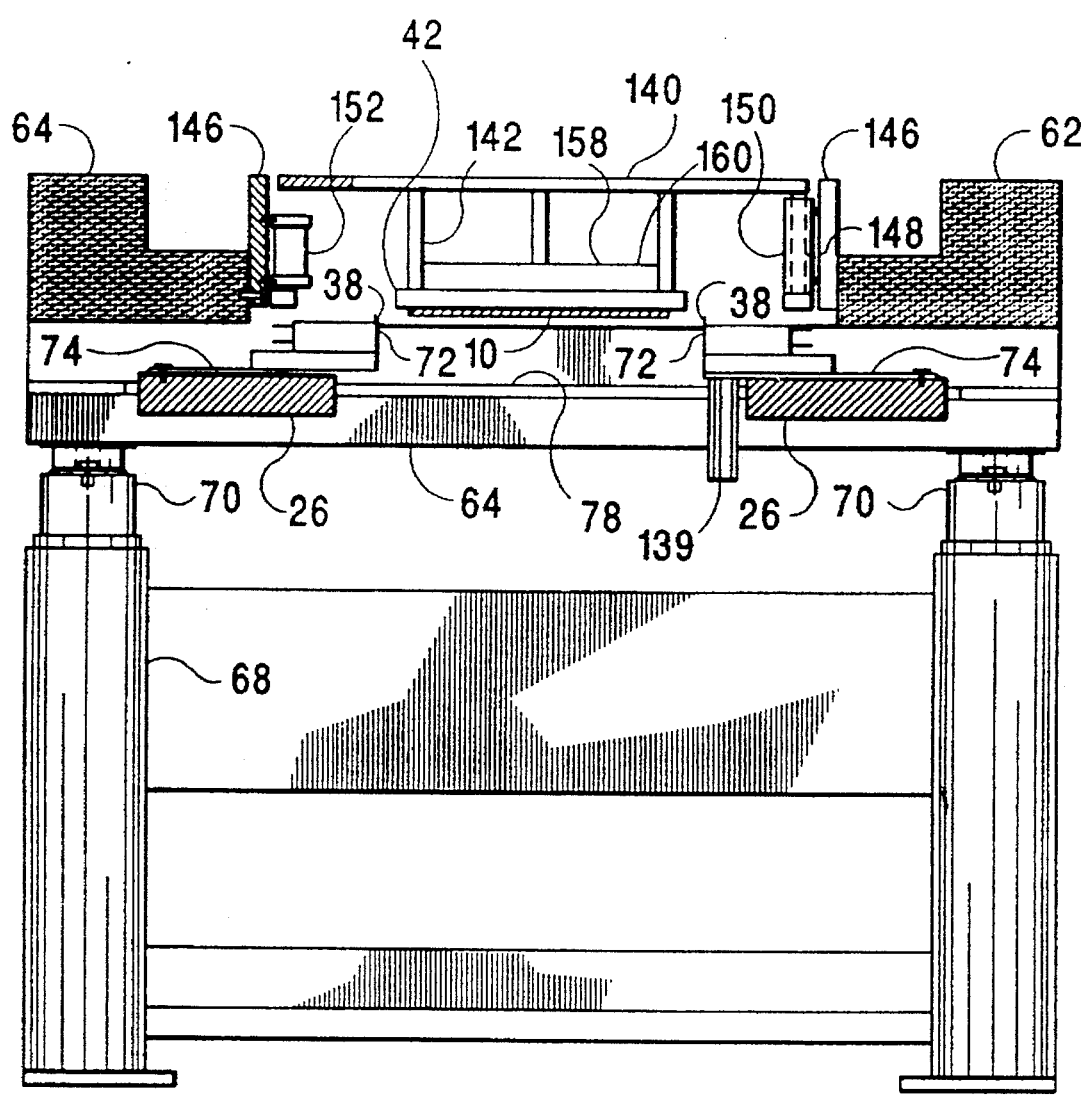
FIG. 5 is a vertical cross-section of the circuit test fixture of FIG. 2, taken as indicated by section lines V—V in FIG. 2.
Figure 6:
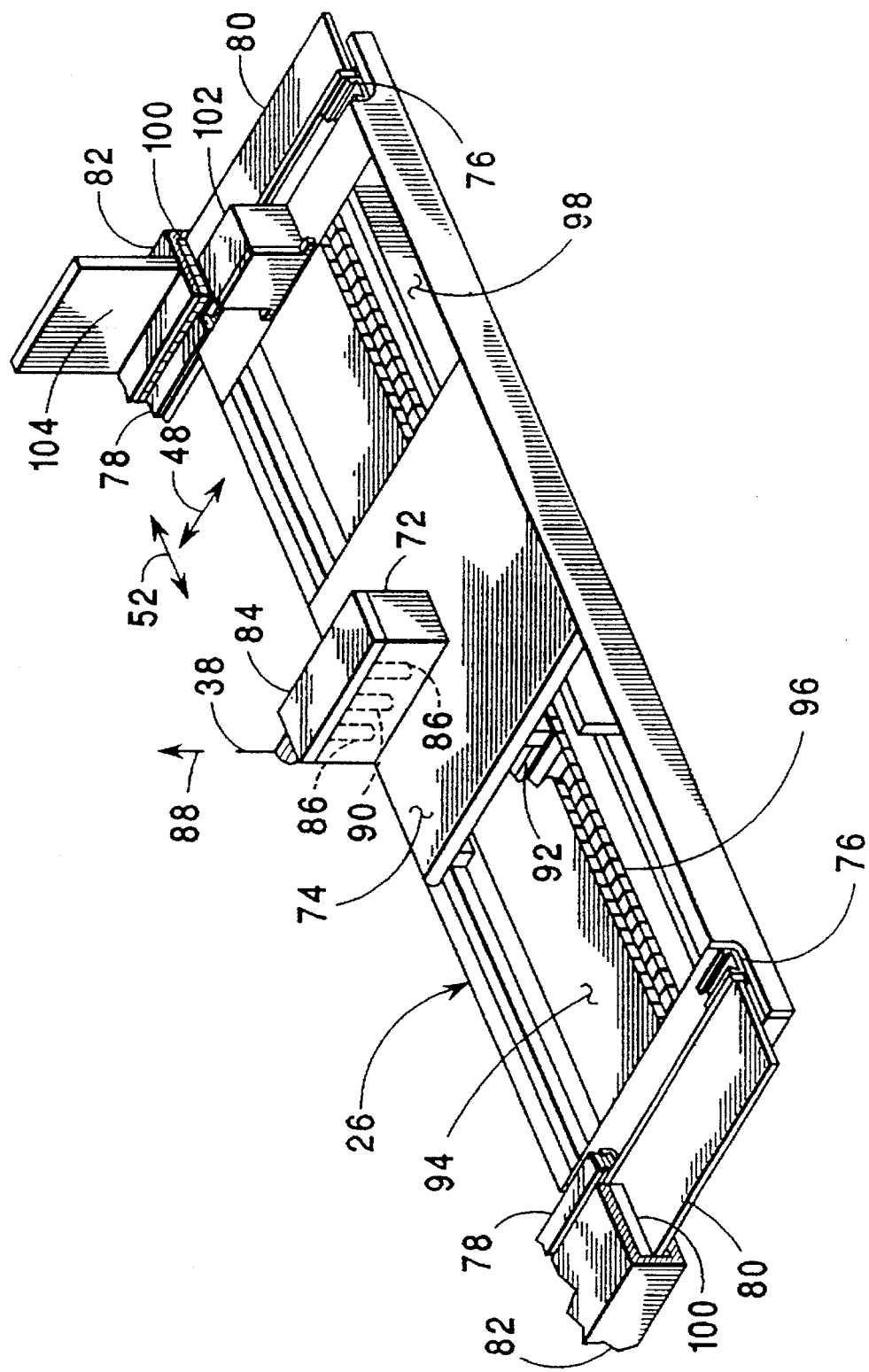
FIG. 6 is an isometric view from above of a gantry structure used to move a test probe under a portion of a flexible substrate within the circuit test fixture of FIG. 2.

Referring to FIGS. 2, 3, and 5, each lower probe tip 38 extends upward from a lower probe carrier 72, which is mounted on a lower carriage 74. Each lower carriage 74 is driven longitudinally along flexible substrate 10, in the directions of arrow 52, within a lower gantry structure 26. Each lower gantry structure 26 is driven transversely to flexible substrate 10, in the direction of arrow 48, with lower gantry bearings 76 sliding along lower rails 78, as electrical current is applied to a linear motor 80 traveling within a magnet channel 82 at each end of the gantry structure 26. Lower rails 78 and the adjacent magnet channels 82 are fastened to transversely extending notched granite beams 64.

FIG. 6 is an isometric view of the lower gantry structure 26 supporting and moving a lower probe tip 38 as generally described above. The lower probe tip 38 is mounted in a lower probe assembly 84, which is in turn mounted in lower probe carrier 72 by means of a pair of air bearings 86, allowing motion of probe assembly 84 in the direction of arrow 88, toward the adjacent surface of substrate 10 (shown in FIG. 2), and subsequently in the direction opposite that of arrow 88, away from the adjacent surface of substrate 10. An electromagnetic actuator 90, such as a voice coil, slides probe assembly 84 along these bearings 86. Probe carrier 72 is in turn fastened to a carriage 74, which is mounted to slide along the gantry structure 26 in the longitudinal directions indicated by arrow 52, being propelled by acceleration forces developed in a linear motor coil 92 sliding in a slot within a channel 94 lined with permanent magnets 96 having alternating polarities. The movement of carriage 74 in the direction of arrows 52 is tracked by an encoder read head (not shown) attached to the carriage to move adjacent to an encoder scale 98, with current levels being applied to linear motor coil 92 to move carriage 74 as required.

As previously described, gantry structure 26 is mounted on a pair of lower rails 78, by means of bearings 76, to move in the transverse directions indicated by arrow 48. At each end of gantry structure 26, a linear motor coil 80 moves within a channel 82 lined with permanent magnets 100 having alternating polarities, as electrical current levels are applied to linear motor coils 80. An encoder read head 102, attached to gantry structure 26 near one end, moves adjacent to encoder scale 104, tracking the movement of gantry structure 26 in the transverse directions of arrow 48.

Thus, the motion of an individual probe tip 38 in three perpendicular directions, as indicated respectively by arrows 48, 52, and 88 is achieved. As described in reference to FIG. 1, two probe tips 32 are applied to an upper side 30 of flexible substrate 10, and two probe tips 38 are applied to a lower side 36 of flexible substrate 10. Thus, in test fixture 18, four probe movement mechanisms of the type described in reference to FIG. 2 are required. Two lower gantry structures 26 are positioned as shown in FIG. 2, to move under the flexible substrate 10 with probes 38 directed upward, while two additional gantry structures 50 are inverted from the position shown in FIG. 6, moving above flexible substrate 10 with upper probe tips 32 (shown in FIG. 2) being directed downward toward the substrate 10. A more detailed description of the gantry structures is found in the cross-referenced co-pending U.S. application Ser. No. 176,810, filed Jan. 3, 1994, entitled "Open Frame Gantry Probing System."

FIGS. 7–13 each show various types of circuit traces which may extend along the flexible substrate 10. A first circuit trace 116 extends only along the top surface 30 of substrate 10, a second circuit trace 118 extends only along the lower surface 36 of substrate 10, and a third circuit trace 120 extends partly along top surface 30 and partly along lower surface 36. Within circuit trace 120, an upper segment 122 is electrically connected to a lower segment 124 by means of a via 126. Within the circuit test fixture 18 (shown in FIG. 2), various tests are applied to these circuit traces using test circuits connected among the two upper probe tips 32, the two lower probe tips 38, and upper backing plate 42 and lower backing plate 40.

FIGS. 7, 8, 11, and 13 show the application of tests within the right portion 34 (shown in FIG. 3) of circuit test fixture 18, as lower probe tips 38 are brought into contact with test points on the lower surface 36 of flexible substrate 10, which is held against upper backing plate 42. This plate 42 includes a conductive, metallic base portion 127, and a dielectric layer 128.

FIGS. 9, 10, and 12 show the application of tests within the left portion 28 (also shown in FIG. 3) of circuit test fixture 18, as upper probe tips 32 are brought into contact with test points on the upper surface 30 of flexible substrate 10, which is held against lower backing plate 40.

Referring first to FIG. 7, electrical measurements are made along a circuit trace 118 extending only along lower surface 36 by applying the lower probe tips 38 to these points, using a test circuit 129 connected between these probe tips 38 to determine the electrical characteristics, such as conductivity, of the circuit extending between the test points.

Referring to FIG. 8, after the probe tips 38 are moved, electrical measurements are made along lower segment 124 of circuit trace 120 in a similar manner.

Referring to FIG. 9, measurements are made along a circuit trace 116 extending only along upper surface 30 in a similar manner, by applying upper probe tips 32 to these points and by using a test circuit 1 31 connected between these probes tips 32.

Referring to FIG. 10, measurements are made along upper segment 122 of circuit trace 120 by applying a single upper probe 32 to a test point on segment 122, using a test circuit 132 connected between this probe 32 and the conductive lower backing plate 40. The remaining upper probe 32, which is electrically isolated in this case, is used to apply pressure between the via 126 and conductive lower backing plate 40. This testing process provides the significant advantage of testing the electrical properties, such as continuity, within via 126, as well as within upper segment 122.

While the advantages of the application of a single-probe method by apparatus in the background art have been discussed above, the discussion presented in reference to FIGS. 7–10 is based on the use of the two-probe method, in which the electrical characteristics of a circuit, such as conductivity are measured between two test points on the circuit trace. Even the method shown in FIG. 10 is an example of the two-probe method, with the conductive backing plate 40 acting as a second probe, connected to a test point at the lower end of the via 126. This two-probe method is particularly useful in testing for open conditions in circuits.

On the other hand, with the single-probe method, a single probe is applied to a test point on a circuit trace, and the electrical characteristics of circuit traces, extending from this point relative to a conductive plane, such as the capacitance between this point and the conductive plane, are measured. The conductive plane must lie along and close to the circuit traces connected to the test point, without coming into electrical contact with these circuit traces. For this measurement, the conductive plane may be either an internal or external conductive plane forming a part of the flexible substrate being tested, or it may be a conductive plane provided by the test fixture. Since flexible substrates of the types which may be readily tested in a test fixture built in accordance with the present invention do not typically include a conductive plane of this sort, it is desirable that the test fixture provide this feature. This method contrasts with the two-probe method, through which electrical measurements, such as conductivity, are performed on a circuit trace extending between two points at which probes are placed.

An important advantage of the single-probe method is that it can be quickly and easily used to detect short circuit conditions between adjacent circuit nets on the flexible substrate. For example, it two nets are inadvertently shorted together, the resulting capacitance measured from a test point on one of the nets to a conductive plane, extending parallel to both of the nets, is generally much higher than the capacitance measured at this point without the shorting condition. This type of testing can be accomplished much more rapidly than the alternative exhaustive testing using the two-probe method, which requires that conductivity between all adjacent nets must be tested before the possibility of short circuits can be ruled out.

Figure 13:
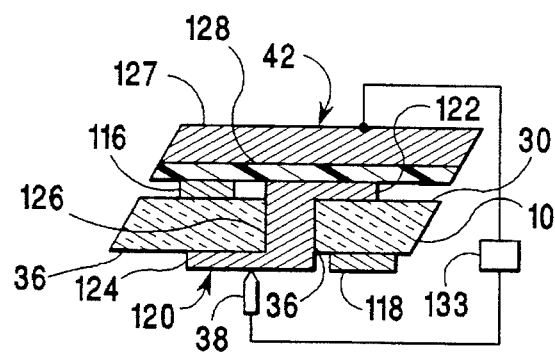
FIG. 13 is a fragmentary schematic vertical cross-section of the test fixture of FIG. 2, showing a single-probe test being applied to a circuit extending along both upper and lower surfaces of the flexible substrate.

FIGS. 11–13 provide examples of the application of the single-probe test method within the circuit test fixture 18.

Referring first to FIG. 11, the electrical characteristics of a circuit 118 extending entirely along the lower surface 36 of flexible substrate 10 are measured, using the single-probe method, by contacting this circuit 118 with a lower probe tip 38, and by using a test circuit 133 connected between the probe 38 and the conductive portion 127 of upper backing plate 42, to determine electrical characteristics. In this example, the capacitance between this circuit 118 and this conductive portion 127 is measured. For this measurement technique to be accurate, the dielectric layer separating conductive portion 127 from the circuit traces extending along upper surface 30 is preferably quite thin, being, for example 0.010 inch (0.25 mm) in thickness.

Referring to FIG. 12, a single-probe test is similarly applied to a circuit trace 116 extending along the upper surface 30 of flexible substrate 10. A test circuit 134 is connected between an upper probe tip 32 and conductive lower backing plate 40 to measure electrical characteristics, such as the capacitance between these elements.

Referring to FIG. 13, the method of FIG. 11 can be used to apply the single-probe method to a circuit 120 extending along both upper side 30 and lower surface 36 of flexible substrate 10. The lower probe 38 is simply moved to a test point on the circuit 120, so that electrical characteristics, such as the capacitance between this circuit 120 and conductive portion 127 of upper backing plate 42 are measured by the test circuit 133.

The presence of insulating layer 128 on one of the backing plates is required to allow the performance of a test for shorts on a circuit, such as circuit 120, having segments extending along both upper surface 30 and lower surface 36 of flexible substrate 10, in the presence of other circuits, such as circuit traces 116 and 118, extending along both upper surface 30 and lower surface 36. Such a circuit 120, extending through a via 126, must be tested for shorts as it is held against the insulating layer 128. When the substrate 10 is held against a conductive backing plate, such as lower backing plate 40 in the example shown, all of the circuit traces and circuit segments exposed to that backing plate are electrically connected. In this condition, it is impossible to determine whether shorts between adjacent circuits are caused by the test process or by failure conditions on the substrate 10. Therefore, if both upper backing plate 42 and lower backing plate 40 exposed conductive surfaces to flexible substrate 10, neither tests with upper probes 32 or lower probes 34 could be employed to determine shorts of circuits extending through vias, such as circuit 120.

On the other hand, one of the backing plates must expose an electrically conducting surface to the flexible substrate 10, in order to allow the test process shown in FIG. 10 to occur. This process is particularly important, since it allows electrical continuity of a circuit extending from one side of substrate 10 to the other to be tested through the via, which is a point where failures in electrical continuity may often occur.

Thus, the use of one backing plate which is conductive to its surface and one backing plate with an insulating layer along its surface facilitates the performance of the various tests described in reference to FIGS. 7–13. Either the upper or lower backing plate in this configuration can be provided with the insulating layer, providing the other backing plate is conductive to its surface. Also, the direction of travel of the flexible substrate within the device can be established so that either the backing plate with the insulating layer or the backing plate without the insulating layer is initially used in tests applied to an individual circuit.

A typical circuit to be tested may include a number of segments extending along upper surface 30 of flexible substrate 10, a number of other segments extending along lower surface 36, and a number of vias 126 extending between various portions of the circuit. Such a circuit is tested by applying the various tests described above in reference to FIGS. 7–13, to the various portions of the circuit.

Referring again to FIG. 2, flexible substrate 10 preferably includes a number of circuits 135 within a repeating pattern (the limits of which are indicated by dashed lines 136) on upper surface 30, with the size of the pattern being limited to that which can be accessed by upper probe points 32 without moving substrate 10. In this way, all of the circuit tests using probes contacting upper surface 30 are completed before the substrate 10 is moved. Similarly, the tests on various circuits (not shown) on the lower surface of flexible substrate 10 are completed before the substrate is moved. Preferably, the distance between adjacent circuit patterns is such that a circuit pattern on the lower surface of substrate 10 can be tested in the right station 34 of circuit test fixture 18 as another circuit pattern is on the upper surface of substrate 10 is simultaneously tested in the left station 28 of fixture 18. When circuits are arranged in this way, one or more adjacent circuits may lie between the circuits being tested on the upper and lower surface.

Referring to FIGS. 2 and 3, flexible substrate 10 preferably also includes a reference mark 137 at a fixed location relative to each repeating circuit pattern. Since this reference mark 137 is formed using the same manufacturing process as the various circuits 135 within the circuit pattern, a maximum level of accuracy in the relative location of the reference mark 137 to each circuit 135 is established, allowing the use of the mark 137 to establish a co-ordinate point for measurements of the movements of upper probes 32. This reference mark 137 is sensed by an upper television camera 138 attached to one of the upper carriages 46 to move in the transverse and longitudinal directions of arrows 48 and 52, respectively, with an associated upper probe tip 32.

Specifically, when the flexible substrate 10 is stopped to allow the performance of circuit tests, the television camera 138 is moved to view the point at which reference mark 137 is stopped. In general, before circuit tests are performed, the co-ordinate system used to determine the positions to which upper probes 32 are driven to test the various circuits 138 is reset to reflect the actual position of the reference mark 137. Thus, while a system, such as an emitter associated with a servomotor 21b driving a roller 21a (both shown in FIG. 1), not preserving the accuracy of the manufacturing process used to place circuits 135 on substrate 10, is used to determine the point at which flexible substrate 10 is stopped each time for the test process, the measurements made with upper television camera 138 correct for inaccuracies in the process of driving and stopping the substrate. In the event that the longitudinal positioning error is greater than an established limit, a correction is made in the next movement of substrate 10 by means of a servomotor 21b. In this way an error in the distance through which substrate 10 is driven between circuit tests is not allowed to accumulate.

A second reference mark (not shown) is formed on the lower surface 36 of flexible substrate 10 by the manufacturing process used to place circuit traces on lower surface 36, and a second, lower television camera 139 is attached to one of the lower carriages 74 to move with an associated lower probe 38. When the flexible substrate 10 is stopped for the performance of circuit tests, this lower camera 139 is used in a manner similar to upper television camera 138, to determine a co-ordinate system for the movement of lower probes 38 among test points on lower surface 36.

Lower backing plate 40 and upper backing plate 42 are preferably mounted within test fixture 18 in such a way that they can each be moved away from flexible substrate 10 when it is determined that the substrate will be moved to expose new circuit patterns for testing. The mechanism for providing such movement will now be discussed, with particular reference being made to FIGS. 2–5.

Referring first to FIGS. 2, 3, and 5, upper backing plate 42 is attached to a carrier plate 140 by three standoff plates 142. This arrangement assists in maintaining upper backing plate 42 in a flat condition, while allowing the application of vertical motion, in the direction of arrow 144, to the plate 42. At each (front and rear) end of carrier plate 140, a frame plate 146 extends upward from places of attachment to a longitudinal beam 62. Carrier plate 140 is mounted to slide vertically between these frame plates 146, by means of a shaft 148 extending downward at each corner of carrier plate 140 to slide within a bearing block 150 attached to an adjacent frame plate 146. Vertical motion is imparted to carrier plate 140 by means of a pneumatic cylinder 152 at each end of the plate 140, also fastened to an adjacent frame plate 146.

Referring to FIGS. 2–4, lower backing plate 40 is similarly attached to a carrier plate 140, which is driven vertically by means of a pair of pneumatic cylinders 152 as shafts 148 slide in bearing blocks 150.

Using these mechanisms, upper backing plate 42 and lower backing plate 40 are moved in opposite directions, away from the flexible substrate 10, to provide clearance between the substrate and the backing plates whenever the substrate is to be moved. In this way the substrate does not drag on any surfaces within the test fixture 18 as it is moved, and the danger of damage to circuit traces or other features on the surface of the substrate is minimized. When movement of the substrate is ended, the backing plates 42 and 40 are moved back to the adjacent surfaces of the substrate, so that circuit testing can continue as described above.

Figure 14:
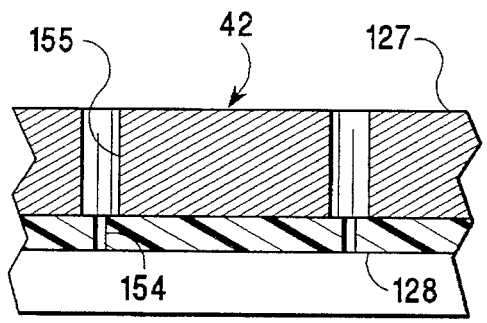
FIG. 14 is a fragmentary vertical cross-section of an upper backing plate, in the circuit test fixture of FIG. 2, showing holes used for forming a partial vacuum under the upper plate.

FIG. 14 is a fragmentary vertical cross-section of upper backing plate 42. A number of small holes 154 are provided in dielectric layer 128, in alignment with holes 155 extending through conductive layer 127, so that air can be drawn through the plate 42. These holes 154 are preferably about 0.010 inch (0.25 mm) in diameter, thus being small enough to prevent significant deflection of the substrate 10 (shown in FIG. 3) stretched across the holes 154. The holes 155 can be somewhat larger in diameter to simplify the fabrication of the backing plate 42.

Figure 15:
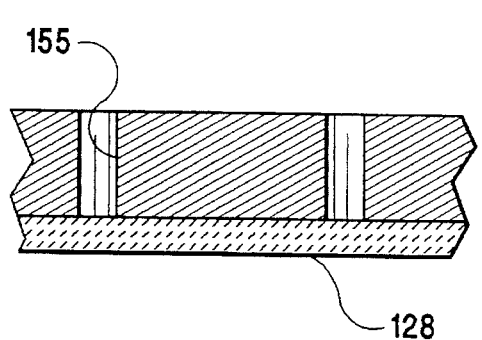
FIG. 15 is a fragmentary vertical cross-section of an alternate form of the upper backing plate of FIG. 14, showing a porous ceramic insulating layer used in the formation of a partial vacuum under the upper plate.

FIG. 15 is a fragmentary vertical cross-section of an alternate construction of upper backing plate 42. Dielectric layer 128 is composed of a porous ceramic material, which provides both a dielectric function and a means for concentrating the airflow through a number of small cracks in the layer 128 into the holes 155 in conductive layer 127.

Referring again to FIGS. 3 and 5, a vacuum plenum 158 is mounted to an upper side 160 of upper backing plate 42, with air being withdrawn through small holes 155 (shown in FIGS. 14 and 15) and through a hose connection 162 fastened to this plenum 158. In this way, a vacuum is applied through the upper plate 42 to assure that sagging of the flexible substrate 10 does not occur during the test process. Before the upper backing plate 42 is moved away from flexible substrate 10 to allow motion of the substrate, this plenum 158 is opened to the atmosphere, releasing the vacuum holding the substrate against the lower surface of plate 42. After the substrate 10 is moved, the vacuum is re-applied through plenum 158.

Figure 16:
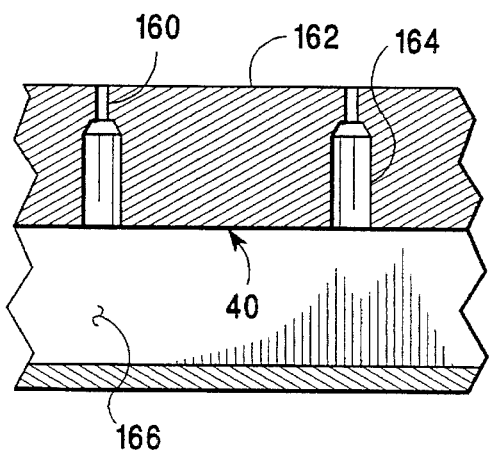
FIG. 16 is a fragmentary vertical cross-section of a lower backing plate in the circuit test fixture of FIG. 2, showing holes used for forming a partial vacuum above the lower plate.

FIG. 16 is a fragmentary vertical cross-section of an optional version of lower backing plate 40, showing a number of small holes 160 extending to an upper surface 162. To simplify the process of making this part, larger holes 164 extend downward to another plenum chamber 166. While the vacuum which can be established using this version of the lower backing plate is not necessary to prevent sagging, it may be used to eliminate a tendency to establish an air cushion or bubble between the flexible substrate 10 and the lower backing plate 40.

The present invention provides some, but not all, of the advantages provided by the invention described in U.S. patent application Ser. No. 176,810, filed Jan. 3, 1994, and cross-referenced above as a co-pending application. Specifically, this co-pending application provides a single, square area where circuits on both upper and lower surfaces of a circuit card are tested. Two gantry structures move on each side of the circuit card, with the gantry structures below the circuit card moving in a direction perpendicular to the direction in which the gantry structures above the circuit card move. Thus, the four sides of a square frame are each used to support a gantry rail in a structure which is as simple as possible, when the functions to be performed are considered. The square open area thus provided is beneficial in providing access to the card and to the mechanism, and the overall size of the test device is minimized. On the other hand, the present invention provides separate areas 28 and 34 (shown in FIG. 2), which are displaced longitudinally along the flexible substrate 10, for testing surfaces on the upper and lower surfaces of the substrate. A test device built according to the present invention is about twice as large as a test device built according to this co-pending application, and the embodiment of the present invention described above requires the addition of a transverse support bar 66 to the frame. However, splitting the areas 28 and 34 used to apply tests to upper and lower surfaces of the flexible substrate 10, allows the use of backing plates 40 and 42, which provide solid support for the flexible substrate 10 as circuits in an entire circuit pattern are tested on each side of the substrate. This co-pending application does not offer such support, as a device is provided for use with rigid, not flexible, circuit substrates.

The other co-pending application cross-referenced above, U.S. patent application Ser. No. 219,610, filed Mar. 29, 1994, describes another method for handling a flexible substrate through the circuit probing process. The substrate is pulled between two plates, which have slots extending transversely in a staggered pattern. Opposite each slot, a plate segment forms mechanical support backing up the flexible substrate during the probing process. Compared to the present invention, the device of this co-pending application has the advantage of being usually smaller, since the same general area is used for testing circuits on both the upper and lower surfaces of the flexible substrate. However, a disadvantage of the device of this co-pending application is that, while the flexible substrate is held stationary for the testing process, only a pattern of strips, corresponding to the slots in the plates, is accessible for testing, making it necessary to move the substrate several times to apply all of the tests required for a circuit. On the other hand, with the present invention, all of the circuits on one side of the substrate can be tested before the substrate is moved, and, if preferable conditions are met, the circuits on the other side of the substrate can be simultaneously tested, as well.

While the invention has been described in its preferred form or embodiment with some degree of particularity, it is understood that this description has been given only by way of example and that numerous changes in the details of construction, fabrication and use, including the combination and arrangement of parts, may be made without departing from the spirit and scope of the invention.

What is claimed is:

1. Apparatus for measuring electrical characteristics of circuit patterns extending along both sides of a flexible substrate, said apparatus comprising:

means for feeding said substrate in a longitudinal direction through said apparatus and for stopping said substrate in a preferred location;

a first station of said apparatus, within which a first probe is movable adjacent to, and into contact with, a first side of said substrate, said first probe being movable only within said first station, said first station including a first backing plate extending externally to said substrate adjacent a second side of said substrate, said second side being opposite said first side of said substrate;

a second station of said apparatus, throughout which a second probe is movable adjacent to, and into contact with, said second side of said substrate, said second probe being movable only within said second station, said second station being displaced from said first station through an offset distance in said longitudinal direction, said second station including a second backing plate extending externally to said substrate adjacent said first side of said substrate; and electronic measuring apparatus connected to said first and second probes to measure circuit characteristics.

2. Apparatus for measuring electrical characteristics of circuit patterns extending along both sides of a flexible substrate, said apparatus comprising:

means for feeding said substrate in a longitudinal direction through said apparatus and for stopping said substrate in a preferred location;

a first station of said apparatus, within which a first probe is movable adjacent to, and into contact with, a first side of said substrate, said first probe being movable only within said first station, said first station including a first backing plate extending adjacent a second side of said substrate, said second side being opposite said first side of said substrate, wherein said first backing plate is electrically conductive, including a conductive surface adjacent said substrate;

a second station of said apparatus, throughout which a second probe is movable adjacent to, and into contact with, said second side of said substrate, said second probe being movable only within said second station, said second station being displaced from said first station through an offset distance in said longitudinal direction, said second station including a second backing plate extending adjacent said first side of said substrate, wherein said second backing plate is electrically conductive, with said second backing plate including an insulating sheet adjacent said substrate;

electronic measuring apparatus connected to said first and second probes to measure circuit characteristics; and electronic measuring apparatus connected to said first and second backing plates to measure circuit characteristics.

3. The apparatus of claim 1, comprising in addition:

a third probe movable within said first station adjacent to, and into contact with, said first side of said substrate, said third probe being movable only within said first station;

a fourth probe movable within said second station adjacent to, and into contact with, said second side of said substrate, said fourth probe being movable only within said second station; and electronic measuring apparatus connected to said first and second probes to measure circuit characteristics.

4. The apparatus of claim 2:

wherein said apparatus comprises in addition a frame having first and second longitudinal frame members extending in a parallel, spaced-apart relationship along opposite sides of said first and second stations, said frame having additionally first, second, and third transverse frame members extending, perpendicular to said first longitudinal frame member, between said first and second longitudinal frame members, with said first station extending between said first and second transverse members, and with said second station extending between said second and third transverse frame members;

wherein said first probe is movably mounted in a first gantry carriage, said first gantry carriage sliding on first rails extending along said first and second longitudinal frame members; and wherein said second probe is movably mounted in a second, gantry carriage sliding on second rails extending along said second and third transverse frame members.

5. The apparatus of claim 4, comprising in addition:

a third probe movably mounted in a third gantry carriage, said third gantry carriage sliding on said first rails;

a fourth probe movably mounted in a fourth gantry carriage, said fourth gantry carriage sliding on said second rails; and electronic measuring apparatus connected to said third and fourth probes to measure circuit characteristics.

6. The apparatus of claim 1, comprising in addition means for moving said first and second backing plates away from said substrate when said substrate is fed in said longitudinal direction.

7. The apparatus of claim 3, comprising in addition;

means for locating a first reference marking on said first side of said substrate; and means for moving said first and third probes through a first pattern having a fixed relationship with said first reference marking.

8. The apparatus of claim 7, comprising in addition:

means for locating a second reference marking on said second side of said substrate; and means for moving said second and fourth probes through a second pattern having a fixed relationship with said second reference marking.

9. The apparatus of claim 1, comprising in addition a vacuum system for holding said substrate against said second backing plate by moving air through said second backing plate.

10. Apparatus for detecting shorts between circuits and open conditions within circuits, wherein said circuits extend along first and second sides of a flexible substrate, said second side being opposite said first side, said circuits extending within circuit patterns repeating in a longitudinal direction along said substrate, wherein said apparatus comprises:

substrate transport means for moving said substrate through a test fixture and for stopping said substrate at preferred locations;

a first station of said test fixture, in which said first side of said substrate is exposed in a first direction as said second side of said substrate extends against a first backing plate, said first backing plate being conductive to a contact surface adjacent said substrate;

a second station of said test fixture, in which said second side of said substrate is exposed in said second direction, as said first side of said substrate extends along a second backing plate, said second backing plate including an insulating sheet adjacent said substrate, said second station being offset from said first station in said longitudinal direction;

first and second probes movable within said first station among test points on said circuits extending along said first side of said substrate, said first and second probes being movable only within said first station;

third and fourth probes movable within said second station among test points on said circuits extending along said second side of said substrate, said third and fourth probes being movable only within said second station; and electronic measuring apparatus connected to said probes and to said backing plates to measure circuit characteristics.

11. The apparatus of claim 10, wherein said electronic apparatus comprises:

a first test circuit extending between said first and second probes to measure conductivity therebetween;

a second test circuit extending between said third and fourth probes to measure conductivity therebetween;

a third test circuit extending between said first probe and said first backing plate to measure conductivity therebetween; and a fourth test circuit extending between said second probe and said second backing plate to measure capacitance therebetween.

12. The apparatus of claim 10, comprising in addition means for moving said backing plates into contact with said substrate when said substrate is stopped and out of contact with said substrate when said substrate is moved.

13. The apparatus of claim 10, comprising in addition a vacuum system for holding said substrate against a said backing plate through which air is moved.

14. The apparatus of claim 10, wherein said substrate transport means moves said substrate through a distance allowing adjacent said circuit patterns to be sequentially exposed within said first station and within said second station.

15. The apparatus of claim 14, comprising in addition:

first sensing means for sensing location of a first reference mark on said first side of said substrate when said substrate is stopped; and means for varying movement of said first and second probes in response to said first sensing means.

16. The apparatus of claim 15, comprising in addition:

second sensing means for sensing location of a second reference mark on said second side of said substrate when said substrate is stopped; and means for varying movement of said third and fourth probes in response to said second sensing means.

17. Apparatus for determining electrical conductivity through a circuit including a first circuit segment extending along a first side of a substrate, a second circuit segment extending along a second side of said substrate, said second side being opposite said first side, and a via connecting said first and second segments, wherein said apparatus comprises:

a first station having first and second probes movable to contact test points along said first circuit segment and a first backing plate extending along said second side of said substrate externally to said substrate;

a second station having a third probe movable to contact a test point along said second circuit segment and a second backing plate extending along said first side of said substrate externally to said substrate, said second backing plate being conductive to a surface thereof adjacent said substrate, said second station being displaced from said first station in a longitudinal direction along said substrate;

means for moving said substrate so that said circuit is moved between said first station and said second station;

first measurement means for measuring conductivity between said first and second probes; and second measurement means for measuring conductivity between said third probe and said second backing plate.

18. The apparatus of claim 17, wherein said first and second probes are movable only within said first station;

wherein said third probe is movable only within said second station;

wherein said second station has in addition a fourth probe movable to contact said second side of said substrate, said fourth probe being movable only within said second station; and wherein said apparatus comprises in addition third measurement means for measuring conductivity between said third probe and said fourth probe.

19. Apparatus for determining electrical conductivity through a circuit including a first circuit segment extending along a first side of a substrate, a second circuit segment extending along a second side of said substrate, said second side being opposite said first side, and a via connecting said first and second segments, wherein said apparatus comprises:

a first station having first and second probes movable to contact test points along said first circuit segment and a first backing plate extending along said second side of said substrate, wherein said first and second probes are movable only within said first station, and wherein said first backing plate includes a conductive portion and an insulating layer adjacent said substrate;

a second station having a third probe movable to contact a test point along said second circuit segment and a fourth probe movable to contact said second side of said substrate, said third and fourth probes being movable only within said second station, wherein said second station additionally includes a second backing plate extending along said first side of said substrate, said second backing plate being conductive to a surface thereof adjacent said substrate, said second station being displaced from said first station in a longitudinal direction along said substrate, wherein said third probe is movable only within said second station;

means for moving said substrate so that said circuit is moved between said first station and said second station;

first measurement means for measuring conductivity between said first and second probes;

second measurement means for measuring conductivity between said third probe and said second backing plate;

third measurement means for measuring conductivity for measuring conductivity between said third probe and said fourth probe; and fourth measurement means for measuring capacitance between said first probe and said conductive portion of said first backing plate.

20. The apparatus of claim 17, comprising in addition a vacuum system for holding said substrate against said first backing plate, through which air is moved.

* * * * *